(12) United States Patent  
Snyder

(10) Patent No.: US 7,188,063 B1  
(45) Date of Patent: Mar. 6, 2007

(54) CAPTURING TEST/EMULATION AND ENABLING REAL-TIME DEBUGGING USING AN FPGA FOR IN-CIRCUIT EMULATION

(75) Inventor: Warren Snyder, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 800 days.

(21) Appl. No.: 09/975,104

(22) Filed: Oct. 10, 2001

Related U.S. Application Data

(60) Provisional application No. 60/243,708, filed on Oct. 26, 2000.

(51) Int. Cl.
*G06F 9/455* (2006.01)

(52) U.S. Cl. ............. 703/26; 703/27; 703/28; 714/47

(58) Field of Classification Search ........... 703/23–28; 714/25, 26, 39; 717/128
See application file for complete search history.

(56) References Cited

U.S. PATENT DOCUMENTS

| | | | |
|---|---|---|---|
| 5,202,687 A | | 4/1993 | Distinti ............... 341/158 |
| 5,371,878 A | * | 12/1994 | Coker ................. 703/28 |
| 5,493,723 A | * | 2/1996 | Beck et al. ............ 703/28 |
| 5,978,937 A | * | 11/1999 | Miyamori et al. ........ 714/45 |
| 6,016,554 A | * | 1/2000 | Skrovan et al. ......... 714/25 |
| 6,061,511 A | * | 5/2000 | Marantz et al. ......... 703/28 |
| 6,134,516 A | * | 10/2000 | Wang et al. ........... 703/27 |
| 6,144,327 A | | 11/2000 | Distinti et al. ......... 341/126 |
| 6,173,419 B1 | * | 1/2001 | Barnett ............... 714/28 |
| 6,460,172 B1 | | 10/2002 | Insenser Farre et al. .... 716/17 |
| 6,587,995 B1 | * | 7/2003 | Duboc et al. ........... 716/4 |
| 6,704,889 B2 | * | 3/2004 | Veenstra et al. ........ 714/39 |
| 6,732,068 B2 | * | 5/2004 | Sample et al. .......... 703/24 |
| 6,934,674 B1 | * | 8/2005 | Douezy et al. .......... 703/23 |

OTHER PUBLICATIONS

Marsh, "Smart Tools Illuminate Deeply Embedded Systems," EDN, vol. 45 No. 3, pp. 129-138 (Feb. 3, 2000).*
Huang et al, "ICEBERG: An Embedded In-circuit Emulator Synthesizer for Microcontrollers," Proceedings of the 36th Design Automation Conference, pp. 580-585 (Jun. 1999).*
York et al, "On-chip Support Needer for SOC Debug," Electronic Engineering Times, pp. 104, 110 (Jun. 14, 1999).*
CYPR-CD00182; "In-System Chip Emulator Architecture"; Oct. 10, 2001; U.S. Appl. No. 09/975,115; Snyder et al.

(Continued)

*Primary Examiner*—Thai Phan

(57) ABSTRACT

A method for obtaining real-time debug information, e.g., state information and trace information, from an FPGA acting as a virtual microcontroller that is attached to a microcontroller under test. The two devices, the microcontroller and the FPGA execute the same instructions in lock-step with the FPGA acting as an emulator. The FPGA emulates the actual microcontroller and relieves the actual microcontroller from having debug logic installed thereon. FPGA and microcontroller, are coupled using a four pin interface. The FPGA is directly coupled to the PC for both programming and control. The system is implemented such that the microcontroller forwards information regarding I/O reads, interrupt vector information and watchdog information to the FPGA in time before the execution of the next instruction. Thus, the FPGA has an exact copy of the state information of the microcontroller.

15 Claims, 5 Drawing Sheets

OTHER PUBLICATIONS

CYPR-CD00184; "Host to FPGA Interface In An In-Circuit Emulation System"; Oct. 10, 2001; U.S. Appl. No. 09/975,105; Nemecek.

CYPR-CD00185; "Emulator Chip-Board Architecture And Interface"; Oct. 1, 2001; U.S. Appl. No. 09/975,030; Snyder et al.

CYPR-CD00186 "Method For Breaking Execution of Test Code In A Dut And Emulator Chip Essentially Simultaneously And Handling Complex Breakpoint Events"; Oct. 10, 2001; U.S. Appl. No. 09/975,338; Nemecek et al.

* cited by examiner

CAPTURING TEST/EMULATION AND ENABLING REAL-TIME DEBUGGING USING AN FPGA FOR IN-CIRCUIT EMULATION

CROSS REFERENCE TO RELATED DOCUMENTS

This application is related to U.S. patent application Ser. No. 09/975,115, to Warren Snyder, et al., entitled "IN-SYSTEM CHIP EMULATOR ARCHITECTURE"; and to U.S. patent application Ser. No. 09/975,030, to Warren Snyder, et al., entitled "EMULATOR CHIP/BOARD ARCHITECTURE AND INTERFACE"; and to U.S. patent application Ser. No. 09/975,338, to Warren Snyder, et al., entitled "METHOD FOR BREAKING EXECUTION OF (TEST) CODE IN A DUT AND EMULATOR CHIP ESSENTIALLY SIMULTANEOUSLY AND HANDLING COMPLEX BREAKPOINT EVENTS"; and to U.S. patent application Ser. No. 09/975,105, to Craig Nemecek, entitled "HOST TO FPGA INTERFACE IN AN IN-CIRCUIT EMULATION SYSTEM." Each of these applications is filed on the same date as the present application and is hereby incorporated by reference as though disclosed fully herein. This application is also related to and claims priority benefit under 35 U.S.C. § 119(e) of provisional patent application Ser. No. 60/243,708 filed Oct. 26, 2000 to Snyder, et al. entitled "Advanced Programmable Microcontroller Device" which is hereby incorporated herein by reference.

FIELD OF THE INVENTION

This invention relates generally to the field of in-circuit emulation. More particularly, this invention relates to a method for obtaining real-time debugging information from an FPGA operating as a "virtual" device coupled to the device under test.

BACKGROUND OF THE INVENTION

In-circuit emulation (ICE) has been used by software and hardware developers for a number of years as a development tool to emulate the operation of complex circuit building blocks and permit diagnosis and debugging of hardware and software. Such in-circuit emulation is most commonly used currently to analyze and debug the behavior of complex devices such as microcontrollers and microprocessors that have internal structures that are far too complex to readily model using computer simulation software alone.

FIG. 1 illustrates an exemplary conventional in-circuit emulation arrangement 100 used to model, analyze and debug the operation of a microcontroller device. In this arrangement, a host computer (e.g., a personal computer) 110 is connected to a debug logic block 120 which is further connected to a special version of the microcontroller device that has been developed specially for use in emulation. Operational instructions are loaded from the host computer 110 through the debug logic 120 to the special version of the microcontroller 130. The debug logic 120 monitors operation of the microcontroller 130 as the instructions are executed. Depending upon the application, this operation may be monitored while the special version of the microcontroller 130 is interconnected with the circuitry that is intended to interface a production version of the microcontroller in the finished product under development. Such interconnection may be via simulation within host computer 110 or as actual circuitry or some combination thereof. As the circuit is stepped through its operation, the debug logic gathers information about the state of various components of the microcontroller 130 during operation and feeds that information back to the host computer 110 for analysis.

During the course of the analysis, various trace information such as time stamps, register values, data memory content, etc. may be logged in the host computer 110 for analysis and debugging by the designer. Additionally, it is generally the case that various break points can be defined by the designer that cause the program to halt execution at various points in the operation to permit detailed analysis. Other debugging tools may also be provided to enable the user to debug the operation of the circuit.

In-circuit emulation systems such as 100 have a number of disadvantages and limitations. In earlier systems, the microcontroller 130 might have been simply the production version of the microcontroller itself with no special debugging features. In such systems, the information that can be gathered by the ICE system 100 is limited to that which is available at the pinouts of the microcontroller 130 (or which can be extracted from the microcontroller using clever programming or special coding supported by the processor).

Enhancements to such early systems provided the microcontroller or other processor with an array of built-in debugging tools that use standard pins on the part and built-in instructions that facilitated in-circuit emulation. In such enhanced processors, the emulation tools are integrated into the part and thus become a design constraint for developing and improving the part. Thus, support for the debugging instruction code and the like can increase the cost and complexity of the circuit.

Newer systems often use a so-called "bond-out" microcontroller. A bond-out version of the microcontroller is a version of the production microcontroller that has been designed with special wirebonding pads on the chip that are not normally connected in the production wirebonding. The bond-out version connects these pads to pins on the microcontroller package to permit access to otherwise inaccessible points of the circuit to facilitate debugging. This technique is in common use, but has the disadvantage of imposing significant limitations on the circuit layout to permit space and circuitry associated with the special wirebonding pads. Additionally, it is usually the case that substantial interface circuitry and other special circuitry to facilitate the debugging and bond-out has to be added to the circuit. This increases the complexity, size, power consumption and potentially reduces the yield of the production part. Moreover, development resources are required to lay out the bond-out circuitry and pads and do associated design of such bond-out circuitry. Additionally, instruction code must generally be provided and supported for such an implementation. Such resources may have to be applied with every updated version of the part and may significantly impact speed, cost or flexibility in development of improved versions of the part.

A third technique, one that is used in the PENTIUM® and PENTIUM PRO™ series of microprocessors available from Intel Corporation, provides a special "probe mode" of operation of the processor. When the processor is placed in this probe mode, a number of internal signals are routed to a "debug port" for use by the in-circuit emulation system. This debug port is used to permit the in-circuit emulation system to communicate with the processors at all times and, when placed in probe mode, to read otherwise inaccessible probe points within the processor. Of course, providing such a probe mode requires significant design resources to design in all such probe and debug functions and associated instruction code support into the standard processor. This, of course, increases development cost, chip complexity and chip size. Moreover, such facilities become a part of the processor design which must be carried through and updated as required as enhancements to the original design are developed.

SUMMARY OF THE INVENTION

The present invention relates generally to in-circuit emulation. Objects, advantages and features of the invention will become apparent to those skilled in the art upon consideration of the following detailed description of the invention.

In one embodiment consistent with the present invention, a method is provided for obtaining real-time debug information, e.g., state information and trace information, from an FPGA acting as a virtual microcontroller that is attached to a microcontroller under test. The two devices, the microcontroller and the FPGA execute the same instructions in lock-step with the FPGA acting as an emulator. The FPGA emulates the actual microcontroller and relieves the actual microcontroller from having debug logic installed thereon. FPGA and microcontroller, are coupled using a four pin interface. The FPGA is directly coupled to the PC for both programming and control. The system is implemented such that the microcontroller forwards information regarding I/O reads, interrupt vector information and watchdog information to the FPGA in time before the execution of the next instruction. Thus, the FPGA has an exact copy of the state information of the microcontroller. This method has many advantages such as for example, robust debugging capability required for complex programmable microcontroller chip, delivery of real-time trace and state information to a logic analyzer system without interrupting the device under test; and the FPGA eliminates the need for designing and maintaining a special microcontroller chip specially adapted just for debugging, this accomplished by providing a "virtual microcontroller" using the FPGA.

A method of obtaining debug information, in an embodiment consistent with the present invention includes executing a sequence of instructions by a device under test (DUT); executing the sequence of instructions by an emulator device emulating the functions of the DUT and executing the sequence of instructions in lock-step fashion with the DUT; the DUT conveying I/O read information to the emulator device; and a host computer system reading real-time state and debug information from the emulator device without interrupting the DUT.

Another method of obtaining debug information, consistent with an embodiment of the present invention includes a) executing a sequence of instructions by a microcontroller device; b) in synchronization with a), an emulator device emulating the functions of the microcontroller and executing the sequence of instructions in lock-step fashion with the microcontroller; c) the microcontroller conveying I/O read information to the emulator device; and d) a host computer system reading real-time state and debug information from the emulator without interrupting the microcontroller.

The above summaries are intended to illustrate exemplary embodiments of the invention, which will be best understood in conjunction with the detailed description to follow, and are not intended to limit the scope of the appended claims.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
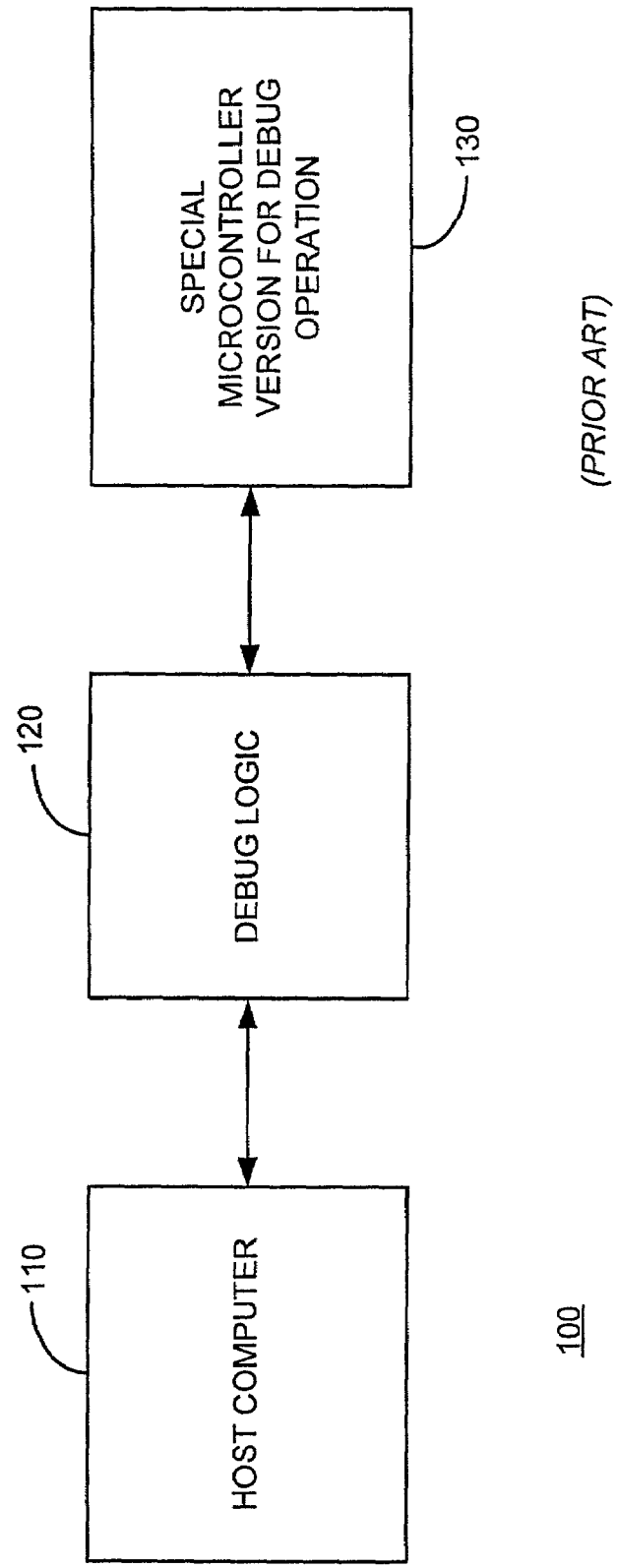
FIG. 1 is a block diagram of a conventional In-Circuit Emulation system.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "transferring" or "executing"

or "determining" or "instructing" or "issuing" or "halting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

CAPTURING TEST/EMULATION AND ENABLING REAL-TIME DEBUGGING USING AN FPGA FOR IN-CIRCUIT EMULATION IN ACCORDANCE WITH THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

A commercial ICE system utilizing the present invention is available from Cypress MicroSystems, Inc., for the CY8C25xxx/26xxx series of microcontrollers. Detailed information regarding this commercial product is available from Cypress MicroSystems, Inc., 22027 17th Avenue SE, Suite 201, Bothell, Wash. 98021 in the form of version 1.11 of "PSOC™ Designer: Integrated Development Environment User Guide", which is hereby incorporated by reference. ("PSOC" is a trademark of Cypress MicroSystems, Inc.) While the present invention is described in terms of an ICE system for the above exemplary microcontroller device, the invention is equally applicable to other complex circuitry including microprocessors and other circuitry that is suitable for analysis and debugging using in-circuit emulation. Moreover, the invention is not limited to the exact implementation details of the exemplary embodiment used herein for illustrative purposes.

Figure 2:
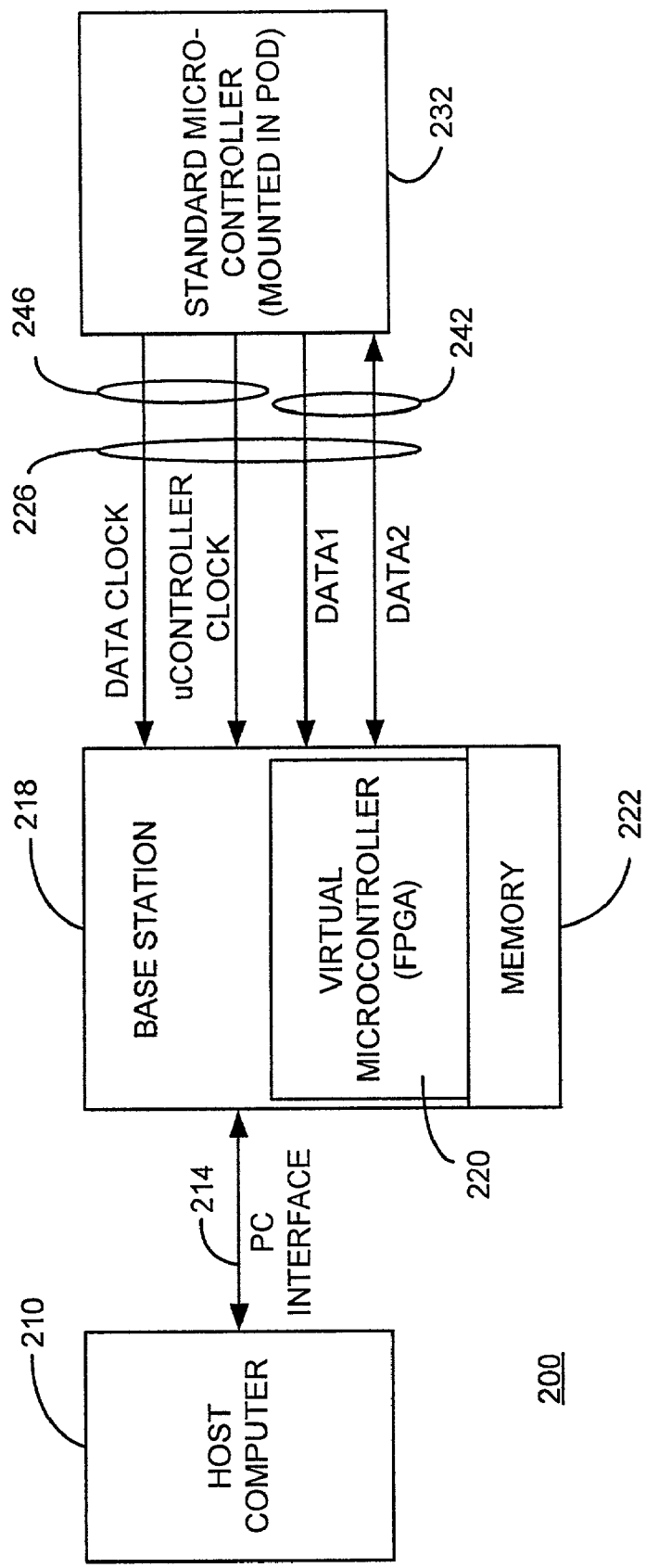
FIG. 2 is a block diagram of an exemplary In-Circuit Emulation system consistent with certain microcontroller embodiments of the present invention.

Referring now to FIG. 2, an architecture for implementation of an embodiment of an ICE system of the present invention is illustrated as system 200. In system 200, a Host computer 210 (e.g., a personal computer based on a PENTIUM® class microprocessor; "PENTIUM" is a registered trademark of Intel Corporation, Santa Clara, Calif.) is interconnected (e.g., using a standard PC interface 214 such as a parallel printer port connection, a universal serial port (USB) connection, etc.) with a base station 218. The host computer 210 generally operates to run an ICE computer program to control the emulation process and further operates in the capacity of a logic analyzer to permit a user to view information provided from the base station 218 for use in analyzing and debugging a system under test or development.

The base station 218 is based upon a general purpose programmable hardware device such as a gate array configured to function as a functionally equivalent "virtual microcontroller" 220 (or other device under test (DUT)). This is accomplished using an associated integral memory 222 which stores program instructions, data, trace information and other associated information. Thus, the base station is configured as an emulator of the internal microprocessor portion of the microcontroller 232. In preferred embodiments, a field programmable gate array FPGA (or other programmable logic device) is configured to function as the virtual microcontroller 220. The FPGA and virtual microcontroller 220 will be referred to interchangeably herein. The base station 218 is coupled (e.g., using a four wire interface 226) to a standard production microcontroller 232 mounted in a mounting device referred to as a "pod". The pod, in certain embodiments, provides connections to the microcontroller 232 that permit external probing as well as interconnection with other circuitry as might be used to simulate a system under development.

The FPGA of the base station 218 of the current embodiment is designed to emulate the core processor functionality (microprocessor functions, Arithmetic Logic Unit functions and RAM and ROM memory functions) of the CY8C25xxx/26xxx series microcontrollers. The CY8C25xxx/26xxx series of microcontrollers also incorporates I/O functions and an interrupt controller as well as programmable digital and analog circuitry. This circuitry need not be modeled using the FPGA 220. Instead, the I/O read information, interrupt vectors and other information can be passed to the FPGA 220 from the microcontroller 232 over the interface 226 as will be described later.

In order to minimize the need for any special ICE related functions on the microcontroller 232 itself, the FPGA 220 and associated circuitry of the base station 218 are designed to operate functionally in a manner identically to that of microprocessor portion of the production microcontroller, but to provide for access to extensive debug tools including readout of registers and memory locations to facilitate traces and other debugging operations.

The base station 218's virtual microcontroller 220 operates to execute the code programmed into the microcontroller 232 in lock-step operation with the microcontroller 232. Thus, the actual microcontroller 232 is freed of any need to provide significant special facilities for ICE, since any such facilities can be provided in the virtual microcontroller 220. The base station 218's virtual microcontroller 220 and microcontroller 232 operate together such that I/O reads and interrupts are fully supported in real time. The combination of real and virtual microcontroller behave just as the microcontroller 232 would alone under normal operating conditions. I/O reads and interrupt vectors are transferred from the microcontroller 232 to the base station 218 as will be described later. Base station 218 is then able to provide the host computer 210 with the I/O reads and interrupt vectors as well as an array of information internal to the microcontroller 232 within memory and register locations that are otherwise inaccessible.

In the designing of a microcontroller or other complex circuit such as the microcontroller 232, it is common to implement the design using the VERILOG® language (or other suitable language; "VERILOG" is a registered trademark of Gateway Design Automation Corp., Littleton, Mass.). Thus, it is common that the full functional design description of the microcontroller is fully available in a software format. The base station 218 of the current embodiment is based upon the commercially available SPARTAN® series of FPGAs from Xilinx, Inc., 2100 Logic Drive, San Jose, Calif. 95124. The VERILOG description can be used as the input to the FPGA design and synthesis tools available from the FPGA manufacturer to realize the virtual microcontroller 220 (generally after timing adjustments and other debugging). Thus, design and realization of the FPGA implementation of an emulator for the microcontroller (virtual microcontroller) or other device can be readily achieved by use of the VERILOG description along with circuitry to provide interfacing to the base station and the device under test (DUT).

In the embodiment described in connection with FIG. 2, the actual production microcontroller 232 carries out its normal functions in the intended application and passes I/O information and other information needed for debugging to the FPGA 220. The virtual microcontroller 220 implemented within the FPGA of base station 218 serves to provide the operator with visibility into the core processor functions that are inaccessible in the production microcontroller 232. Thus, the FPGA 220, by virtue of operating in lock-step operation with the microcontroller 232 provides an exact duplicate of internal registers, memory contents, interrupt vectors and other useful debug information. Additionally, memory 222 can be used to store information useful in trace operations that are gathered by the FPGA 220 during execution of the program under test. This architecture, therefore, permits the operator to have visibility into the inner workings of the microcontroller 232 without need to provide special bond-outs and expensive circuitry on the microcontroller itself.

The base station 218's FPGA based virtual microcontroller 220, operating under control of host computer 210, carries out the core processor functions of microcontroller 232 and thus contains a functionally exact emulated copy of the contents of the registers and memory of the real microcontroller 232. The ICE system starts both microcontrollers (real and virtual) at the same time and keeps them running in synchronization. The real microcontroller 232 sends I/O data to the base station 218 (and in turn to the ICE software operating on the host computer 210 if required) fast enough to keep the real microcontroller 232 and the virtual microcontroller 220 of base station 218 in synchronization. Whenever the system is halted (i.e., when the system is not emulating), other information such as flash memory programming functions, test functions, etc. can be sent over the interface.

Because the microcontroller 232 operates in synchronization with the virtual microcontroller 220, less data needs to be sent over the four wire interface than would be required in an ICE system otherwise. The type of data sent over the lines is allowed to change depending on when the data is sent in the execution sequence. In other words, depending on the execution sequence time, the information over the data lines can be commands to the real microcontroller 232 or they can be data. Since the clock frequency of the real microcontroller 232 is programmable, it copies its current clock on one of the lines of the four wire interface. Moreover, the lock-step operation of the microcontroller 232 and the virtual microcontroller 220 allows the virtual microcontroller 220 to not require certain resources of the microcontroller 232 such as timers, counters, amplifiers, etc. since they are fully implemented in the microcontroller 232. In addition, the microcontroller 232 (or other DUT) can be debugged in real time without need for extensive debug logic residing on the microcontroller 232, since all registers and memory locations, etc. are available through the virtual microcontroller 220.

In the embodiment illustrated, the basic interface used is a four line interface 226 between microcontroller 232 and base station 218. This interface permits use of a standard five wire Category Five patch cable to connect the microcontroller 232 and base station 218 in one embodiment, but of course, this is not to be considered limiting. The four wire interface 226 of the present embodiment can be functionally divided into two functional portions. A data transport portion 242 carries two data lines in the current embodiment. A clock portion 246 carries a data clock signal plus the microcontroller clock signal for the microcontroller 232. Three additional lines are also provided (not shown) for supply, ground and a reset line. But, the data transport portion 242 and the clock portion 246 are of primary interest, since the supply and reset functions can be readily provided in any other suitable manner.

The two portions of the interface are implemented in the current embodiment using four lines as described, however, in other embodiments, these two portions can be implemented with as few as two wires. In the current embodiment, the microcontroller clock signal can be varied by programming (even dynamically during execution of a program). Therefore, it is desirable to have two clock signals—the microcontroller clock to easily track the microcontroller clock timing as well as a system clock that regulates the data transfer and other operations. However, in other embodiments, particularly where a clock frequency is not changed dynamically, a single clock can be used. The single clock can be multiplied or divided as required to implement the required clocking signals.

The present embodiment using an eight bit microcontroller that only reads eight bits at a time on any given I/O read. Thus, the present microcontroller 232 needs only to effect serializing and transferring a maximum of one eight bit I/O read for each instruction cycle. This is easily accommodated using two data lines transferring four bits each over four system clock cycles. However, using a clock which is two times faster, a single line could equally well transfer the data in the same time. Similarly, four lines could be used to transfer the same data in only two clock cycles. In any case, the objective is to transfer the data in a short enough time to permit the virtual microcontroller 220 to process the data and issue any needed response before the next instruction cycle begins. The time required to accomplish this is held at a minimum in the current invention, since the system synchronization eliminates need for any overhead protocol for transmission of the data.

The current embodiment of the invention uses a four line communication interface and method of communicating between the FPGA within base station 218 (acting as a "virtual microcontroller" 220 or ICE) and the real microcontroller device under test (microcontroller 232). The four line communication interface is time-dependent so that different information can be transferred at different times over a small number of communication lines. Moreover, since the two processors operate in lockstep, there is no need to provide bus arbitration, framing, or other protocol overhead to effect the communication between the microcontroller 232 and the virtual microcontroller 220. This interface is used for, among other things, transferring of I/O data from the microcontroller 232 to the FPGA 220 (since the FPGA emulates only the core processor functions of the microcontroller in the current embodiment). A first interface line (Data1) is a data line used by the microcontroller 232 to send I/O data to the FPGA based virtual microcontroller 220. This line is also used to notify the FPGA 220 of pending interrupts. This Data1 line is only driven by the real microcontroller 232. A second data line (Data2), which is bidirectional, is used by the microcontroller 232 to send I/O data to the FPGA based virtual microcontroller of base station 218. In addition, the FPGA 220 uses the Data2 line to convey halt requests (i.e., to implement simple or complex breakpoints) to the microcontroller 232.

A third interface line is a 24/48 Mhz debug system clock used to drive the virtual microcontroller 220's communication state machines (the logic used within the state controller to communicate with the microcontroller 232). In the current embodiment, this clock always runs at 24 MHz unless the microcontroller 232's internal clock is running at 24 Mhz. In this case the system clock switches to 48 Mhz. Of course, these exact clock speeds are not to be considered limiting, but are presented as illustrative of the current exemplary embodiment. The fourth interface line is the internal microcontroller clock from the microcontroller 232.

A fifth line can be used to provide a system reset signal to effect the simultaneous startup of both microcontrollers. This fifth line provides a convenient mechanism to reset the microcontrollers, but in most environments, the simultaneous startup can also be effected in other ways including switching of power. Sixth and Seventh lines are provided in the current interface to provide power and ground for power supply.

The base station 218's virtual microcontroller 220 communicates with the microcontroller 232 via four signal and clock lines forming a part of the four line interface 226 forming a part of a seven wire connection as described below. The interface signals travel over a short (e.g., one foot) of CAT5 network cable. The ICE transmits break commands to the microcontroller 232 via the base station 218, along with register read/write commands when the microcontroller 232 is halted. The microcontroller 232 uses the interface to return register information when halted, and to send I/O read, interrupt vector, and watchdog information while running. The microcontroller 232 also sends a copy of its internal clocks for the ICE. The four lines of the four line interface are the first four entries in the table below. Each of the signals and their purpose is tabulated below in TABLE 1:

TABLE 1

| Signal Name | Signal Direction with Respect to Base Station 218 | Description |
| --- | --- | --- |
| U_HCLK (Data Clock) | In | 24/48 MHz data clock driven by microcontroller 232. This clock is used to drive the ICE virtual microcontroller communication state machines. This clock always runs at 24 MHz, unless the U_CCLK clock is running at 24 MHz - then it switches to 48 MHz. |
| U_CCLK (microcontroller Clock) | In | The internal microcontroller 232 CPU clock. |
| U_D1_IRQ (Data1) | In | One of two data lines used by the microcontroller 232 to send I/O data to the ICE. This line is also used to notify the ICE of pending interrupts. This line is only driven by the microcontroller 232 (i.e., unidirectional). |
| U_D0_BRQ (Data2) | In/Out | One of two data lines used by the microcontroller 232 to send I/O data to the ICE. The ICE uses this line to convey halt requests and other information to the microcontroller 232. This line is used for bi-directional communication. |
| ICE_POD_RST | Out | Optional active high reset signal to microcontroller 232. |
| ICE_POD_PW_R | Out | Optional power supply to microcontroller 232. |
| ICE_POD_GND | Out | Optional ground wire to microcontroller 232. |

Synchronization between the microcontroller 232 and the virtual microcontroller 220 is achieved by virtue of their virtually identical operation. They are both started simultaneously by a power on or reset signal. They then track each other's operation continuously executing the same instructions using the same clocking signals. The system clock signal and the microcontroller clock signal are shared between the two microcontrollers (real and virtual) so that even if the microprocessor clock is changed during operation, they remain in lock-step.

In accordance with certain embodiments of the invention, a mechanism is provided for allowing the FPGA 220 of base station 218 and the microcontroller 232 to stop at the same instruction in response to a breakpoint event (a break or halt). The FPGA 220 has the ability monitor the microcontroller states of microcontroller 232 for a breakpoint event, due to its lock-step operation with microcontroller 232. In the process of executing an instruction, an internal start of instruction cycle (SOI) signal is generated (by both microcontrollers) that indicates that the device is about to execute a next instruction. If a breakpoint signal (a halt or break signal—the terms "halt" and "break" are used synonymously herein) is generated by the FPGA, the execution of the microcontroller 232 can be stopped at the SOI signal point before the next instruction starts.

Although the SOI signal is labeled as a signal indicating the start of an instruction, the SOI signal is used for multiple purposes in the present microcontroller. It is not required that the SOI signal actually indicate a start of instruction for many purposes, merely that there be a convenient time reference on which to base certain actions. For example, any reference signal that always takes place prior to execution of an instruction can be used as a time reference for reading a halt command. Accordingly, any such available or generated reference signal can be used equivalently as a "halt read" signal without departing from the present invention. That not withstanding, the SOI signal is conveniently used in the current embodiment and will be used as a basis for the explanation that follows, but should not be considered limiting.

Logic within the FPGA 220 of base station 218 allows not only for implementation of simple breakpoint events, but also for producing breakpoints as a result of very complex events. By way of example, and not limitation, a breakpoint can be programmed to occur when a program counter reaches 0x0030, an I/O write is happening and the stack pointer is about to overflow. Other such complex breakpoints can readily be programmed to assist in the process of debugging. Complex breakpoints are allowed, in part, also because the virtual microcontroller 220 has time to carry out complex computations and comparisons after receipt of I/O data transfers from the microcontroller 232 and before the next instruction commences. After the receipt of I/O data from the microcontroller 232, the FPGA 220 of base station 218 has a relatively long amount of computation time to determine if a breakpoint event has occurred or not. In the event a breakpoint has occurred, the microcontroller 232 can be halted and the host processor 210 is informed.

An advantage of this process is that the FPGA 220 and the microcontroller 232 can be stopped at the same time in response to a breakpoint event. Another advantage is that complex and robust breakpoint events are allowed while still maintaining breakpoint synchronization between the two devices. These advantages are achieved with minimal specialized debugging logic (to send I/O data over the interface) and without special bond-out circuitry being required in the microcontroller device under test 232.

Figure 3:
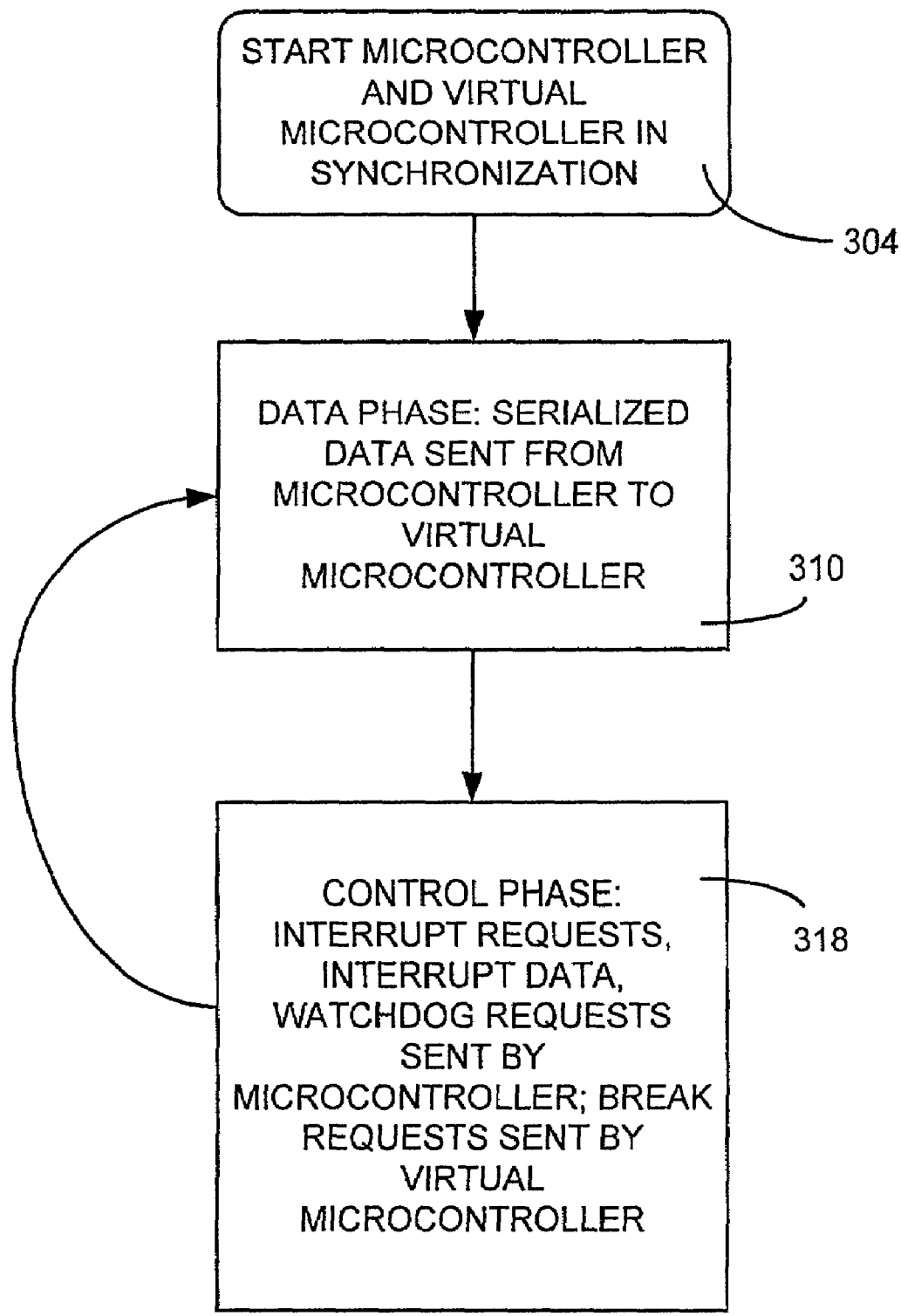
FIG. 3 is an illustration of the operational phases of an In-Circuit Emulation system consistent with an embodiment of the present invention.

Normal operation of the current microcontroller is carried out in a cycle of two distinct stages or phases as illustrated in connection with FIG. 3. The cycle begins with the initial startup or reset of both the microcontroller 232 and the virtual microcontroller 220 at 304. Once both microcontrollers are started in synchronism, the data phase 310 is entered in which serialized data is sent from the microcontroller to the virtual microcontroller. At the start of this phase the internal start of instruction (SOI) signal signifies the beginning of this phase will commence with the next low to high transition of the system clock. In the current embodiment, this data phase lasts four system clock cycles, but this is only intended to be exemplary and not limiting. The SOI signal further indicates that any I/O data read on the previous instruction is now latched into a register and can be serialized and transmitted to the virtual microcontroller. Upon the start of the data phase 310, any such I/O read data (eight bits of data in the current embodiment) is serialized into two four bit nibbles that are transmitted using the Data0 and Data1 lines of the current interface data portion 242. One bit is transmitted per data line at the clock rate of the system clock. Thus, all eight bits are transmitted in the four clock cycles of the data transfer phase.

At the end of the four clock cycle data transfer phase in the current embodiment, the control phase 318 begins. During this control phase, which in the current embodiment may be as short as two microcontroller clock periods (or as long as about fourteen clock periods, depending upon the number of cycles required to execute an instruction), the microcontroller 232 can send interrupt requests, interrupt data, and watchdog requests. Additionally, the virtual microcontroller 220 can issue halt (break) commands. If a halt command is issued, it is read by the microcontroller at the next SOI signal. Once the control phase ends, the data transfer phase repeats. If there is no data to transfer, data1 and data2 remain idle (e.g., at a logic low state). To simplify the circuitry, I/O bus data are sent across the interface on every instruction, even if it is not a bus transfer. Since the virtual microcontroller 220 is operating in synchronization with microcontroller 232 and executing the same instructions, the emulation system knows that data transferred during non I/O read transfers can be ignored.

Figure 4:
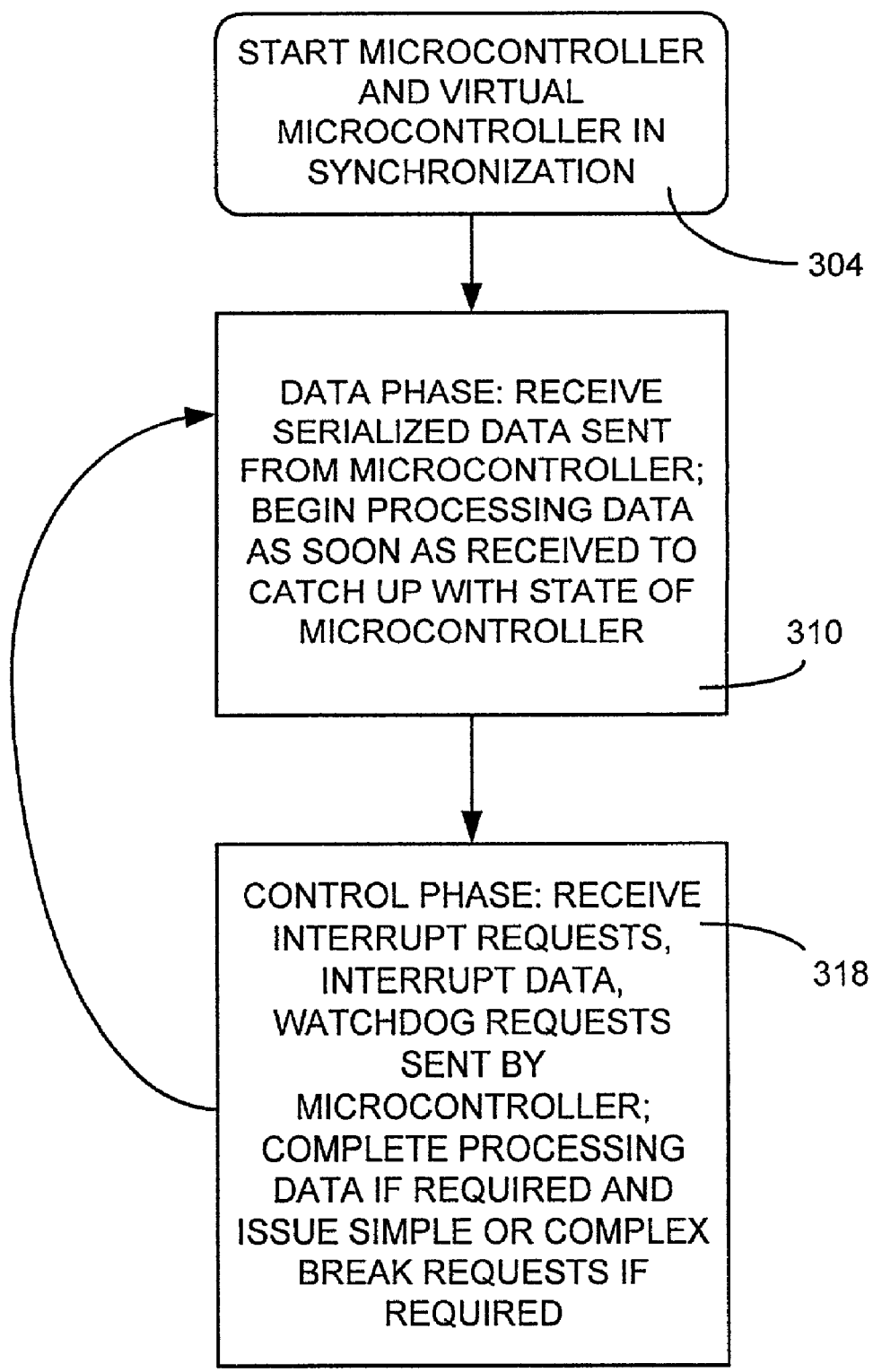
FIG. 4 is an illustration of the operational phases of an In-Circuit Emulation system consistent with an embodiment of the present invention viewed from a virtual microcontroller perspective.

FIG. 4 shows this operational cycle from the perspective of the virtual microcontroller 220. During the data transfer phase 310, the serialized data is received over Data0 and Data1. It should be noted that prior to receipt of this I/O data, the microcontroller 232 has already had access to this data for several clock cycles and has already taken action on the data. However, until receipt of the I/O read data during the data transfer phase 310, the virtual microcontroller 220 has not had access to the data. Thus, upon receipt of the I/O read data during the data phase 310, the virtual microcontroller 220 begins processing the data to catch up with the existing state of microcontroller 232. Moreover, once the I/O data has been read, the host computer 210 or virtual microcontroller 220 may determine that a complex or simple breakpoint has been reached and thus need to issue a break request. Thus, the virtual microcontroller should be able to process the data quickly enough to make such determinations and issue a break request prior to the next SOI. Break requests are read at the internal SOI signal, which also serves as a convenient reference time marker that indicates that I/O data has been read and is available for transmission by the microcontroller 232 to the virtual microcontroller 220.

By operating in the manner described, any breakpoints can be guaranteed to occur in a manner such that both the virtual microcontroller 220 and the microcontroller 232 halt operation in an identical state. Moreover, although the virtual microcontroller 220 and the microcontroller 232 operate on I/O data obtained at different times, both microcontrollers are in complete synchronization by the time each SOI signal occurs. Thus, the virtual microcontroller 220 and the microcontroller 232 can be said to operate in lock-step with respect to a common time reference of the SOI signal as well as with respect to execution of any particular instruction within a set of instructions being executed by both virtual microcontroller 220 and the microcontroller 232.

Figure 5:
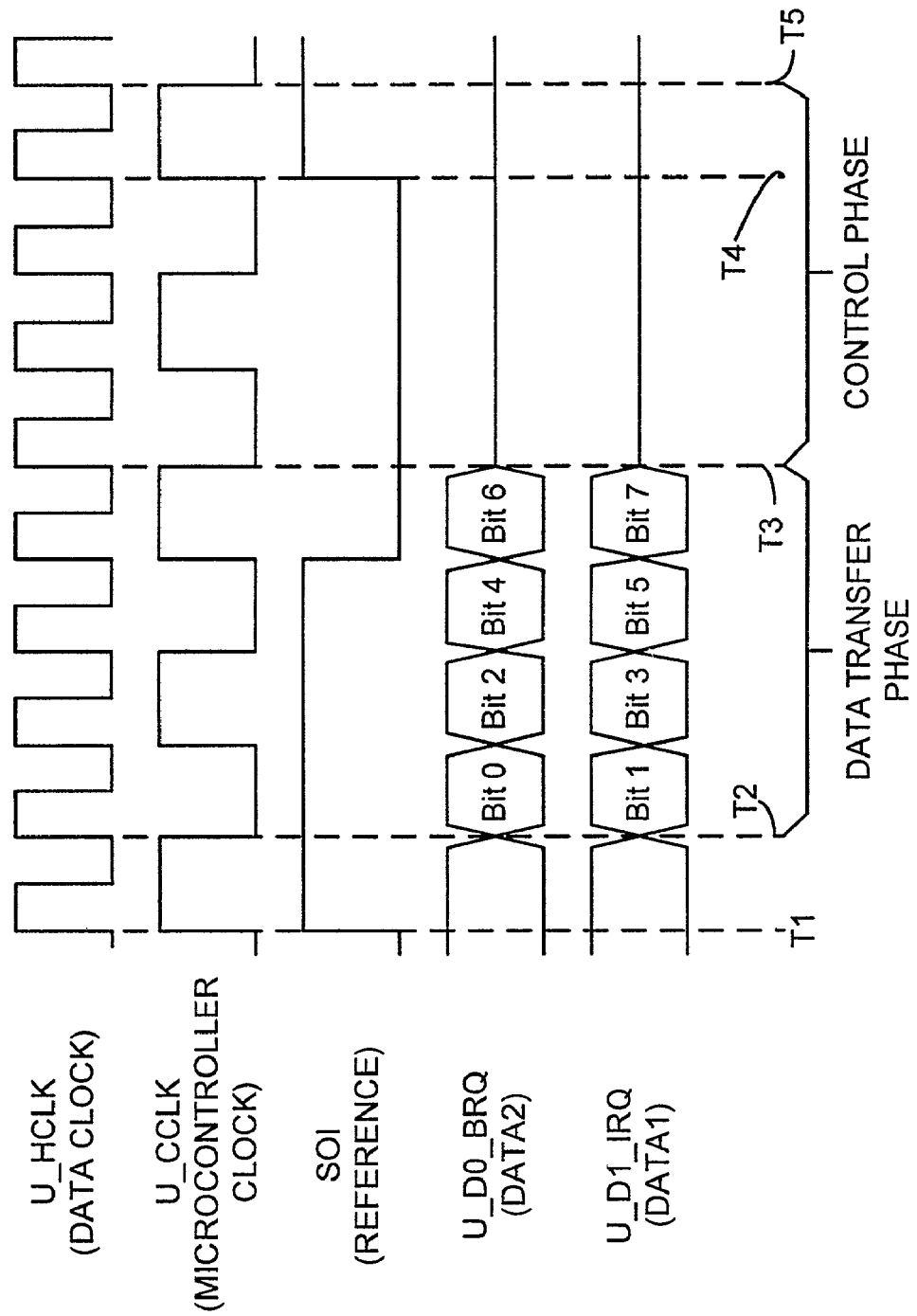
FIG. 5 is a timing diagram useful in understanding an exemplary data and control phase of operation of certain embodiments of the present invention.

A transfer of I/O data as just described is illustrated with reference to the timing diagram of FIG. 5. After the microcontroller 232 completes an I/O read instruction, it sends the read data back to the base station 218 to the virtual microcontroller, since the virtual microcontroller 220 of the present embodiment implements only the core processor functions (and not the I/O functions). The ICE system can expect the incoming data stream for an I/O read to commence with the first positive edge of U_HCLK (the data or system clock) when SOI signal for the following instruction is at a predetermined logic level (e.g., a logic high). Thus, at time T1, the SOI signal makes a transition to a logic high and one system clock cycle later at time T2, the data transfer phase 310 begins. This timing allows the ICE system to get the read data to the emulated accumulator of base station 218 before it is needed by the next instruction's execution. Note that the first SOI pulse shown in FIG. 5 represents the first SOI following the I/O read instruction (but could be any suitable reference time signal). Transfer of the data from the microcontroller 232 is carried out using the two data lines (data2 and data1, shown as U_D0_BRK and U_D1_IRQ) with each line carrying four bits of an eight bit word. During this data transfer phase 310, an eight bit transfer representing the I/O read data can take place from the microcontroller 232 to the base station 210 in the four clock cycles between T2 and T3. The control phase 318 starts at time T3 and continues until the beginning of the next data transfer phase 310. The SOI signal at T4 indicates that the next data transfer phase is about to start and serves as a reference time to read the data2 line to detect the presence of any halt signal from the virtual microcontroller 220. The current control phase 318 ends at T5 and the next data transfer phase 310 begins.

The base station 218 only transmits break (halt) commands to the microcontroller 232 during the control phase. After the microcontroller 232 is halted in response to the break command, the interface can be used to implement memory/register read/write commands. The halt command is read at the SOI signal transition (T1 or T4). The microcontroller 232 uses the interface to return register information when halted, and to send I/O read, interrupt vector and watchdog timer information while running.

To summarize, a break is handled as follows: The ICE asserts U_D0_BRQ (break) to stop the microcontroller 232. When the ICE asserts the break, the microcontroller 232 reads it at the SOI transition to high and stops. The ICE assert breaks during the control phase. The microcontroller 232 samples the U_D0_BRQ line at the rising edge of SOI (at T4) to determine if a break is to take place. After halting, the ICE may issue commands over the U_D0_BRQ line to query the status of various registers and memory locations of the virtual microcontroller or carry out other functions.

In the case of an interrupt, if an interrupt request is pending for the microcontroller 232, the system asserts U_D1_IRQ as an interrupt request during the control phase of the microcontroller 232. Since the interrupt signal comes to the virtual microcontroller 220 from the microcontroller 232 during the control phase, the virtual microcontroller 220 knows the timing of the interrupt signal going forward. That is, the interrupt signal is the synchronizing event rather than the SOI signal. In case of an interrupt, there is no SOI, because the microcontroller 232 performs special interrupt processing including reading the current interrupt vector from the interrupt controller. Since program instructions are not being executed during the interrupt processing, there is no data/control phase. The virtual microcontroller 220 expects the interrupt vector to be passed at a deterministic time across the interface during this special interrupt processing and before execution of instructions proceeds. Since the virtual microcontroller 220 of the current embodiment does not implement an interrupt controller, interrupt vectors are read from the interrupt controller upon receipt of an interrupt request over the interface. The interrupt vector data is passed over the interface using the two data lines as with the I/O read data, following the assertion of an internal microcontroller IVR_N (active low) signal during the control phase. In the current embodiment, an interrupt cycle is approximately 10 clock cycles long. Since the interrupt service cycle is much longer than the time required to transfer the current interrupt vector, the data is easily transferred using the two data lines, with no particular timing issues.

If the microcontroller 232 undergoes a watchdog reset, it asserts the IRQ (interrupt) and BRQ (break) lines indefinitely. The ICE detects this condition and further detects that the microcontroller clock has stopped. This is enough to establish that a watchdog reset has occurred. The ICE applies an external reset, and notifies the ICE software in the host computer 210.

The present invention provides for full in-circuit emulation without need for a special bond-out version of a DUT. This is accomplished using a minimal amount of design embedded within the DUT itself. In the current embodiment, the only functionality required of the production microcontroller itself is to provide for transfer of data over one or two lines forming the data portion of the interface and at least one clock (the data clock, the microcontroller clock is optional). Commands for break, watchdog and interrupt functions are received over the same two data lines. These provisions are simple to implement, and use minimal circuitry. The two additional pinouts used for this function were readily accommodated in the eight bit microcontroller of the current invention.

While the present embodiment is implemented using a processor that does not use pipelined instructions, this is not to be considered limiting. As long as adequate time is available to serialize and transmit data over the interface, the present interface and break management techniques could equally well be implemented in a pipelined processor.

Those skilled in the art will understand that although an FPGA is used in the current exemplary embodiment, this is not to be limiting. An FPGA is used as a convenient mechanism to implement the virtual microcontroller of the present invention. However, other hardware and/or software equivalents could equally well function without the limitation of being fabricated using an FPGA. Moreover, the current invention has been explained in terms of providing in-circuit emulation of the core processing functions of a microcontroller. However, the present invention can be realized for any complex electronic device for which in-circuit emulation is needed including, but not limited to, microprocessors and other complex large scale integration devices without limitation.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

Those skilled in the art will appreciate that the program steps and associated data used to implement the embodiments described above can be implemented using disc storage as well as other forms of storage such as for example Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A method of obtaining debug information, comprising:
   executing a sequence of instructions by a device under test (DUT), wherein said DUT comprises a data line and a clock line;
   executing the sequence of instructions by an emulator device emulating the functions of the DUT and executing the sequence of instructions in lock-step fashion with the DUT, wherein said emulator device shares a clock signal with said DUT;
   the DUT conveying I/O read information to the emulator device over said data line during a data transfer phase; and
   a host computer system reading real-time state and debug information from the emulator device without interrupting the DUT.

2. The method according to claim 1, wherein the DUT and the emulator device operate in a cycle comprising the data transfer phase and a control phase.

3. The method according to claim 1, wherein the I/O read information is conveyed to the emulator device after a start of instruction transition occurs and prior to execution of an instruction.

4. The method according to claim 3, wherein said DUT comprises a second data line, and wherein the I/O read information comprises eight bits of information, and further wherein the I/O read information is conveyed to the emulator device over said two data lines carrying four serial bits each over a time period defined by four system clock cycles.

5. The method according to claim 1, further comprising conveying interrupt vectors from the DUT to the emulator device during an interrupt service cycle.

6. The method according to claim 5, wherein the interrupt service cycle begins after assertion of an interrupt data line.

7. The method according to claim 1, wherein the DUT is selected from one of a microcontroller, a microprocessor, a microcomputer and an electronic circuit device incorporating an internal processor.

8. A method of obtaining debug information, comprising:
   a) executing a sequence of instructions by a microcontroller device, wherein said microcontroller device comprises a data line and a clock line;
   b) in synchronization with a), an emulator device emulating the functions of the microcontroller and executing the sequence of instructions in lock-step fashion with the microcontroller, wherein said emulator device shares a clock signal with said microcontroller device;
   c) the microcontroller conveying I/O read information to the emulator device;
   d) a host computer system reading real-time state and debug information from the emulator without interrupting the microcontroller; and
   e) conveying interrupt vectors from the microcontroller to the emulator device during an interrupt service cycle.

9. The method according to claim 8, wherein the microcontroller and the emulator device operate in a cycle comprising a data transfer phase and a control phase.

10. The method according to claim 9, wherein the I/O read information is conveyed to the emulator device during the data transfer phase.

11. The method according to claim 10, wherein the I/O read information is conveyed to the emulator device after a start of instruction transition occurs and prior to execution of an instruction.

12. The method according to claim 11, wherein said microcontroller comprises a second data line, and wherein the I/O read information comprises eight bits of information, and wherein the I/O read information is conveyed to the emulator device over said two data lines carrying four serial bits each over a time period defined by four system clock cycles.

13. The method according to claim 8, wherein the interrupt service cycle begins after assertion of an interrupt data line.

14. A method of obtaining debug information, comprising:
   executing a sequence of instructions by a device under test (DUT), wherein said DUT comprises two data lines and a clock line;
   executing the sequence of instructions by an emulator device emulating the functions of the DUT and executing the sequence of instructions in lock-step fashion with the DUT, wherein said emulator device shares a clock signal with said DUT;
   the DUT conveying I/O read information to the emulator device;
   a host computer system reading real-time state and debug information from the emulator device without interrupting the DUT;
   the DUT and the emulator device operating in a cycle comprising a data transfer phase and a control phase, wherein I/O read information is conveyed to the emulator device during the data transfer phase after a start of instruction transition occurs and prior to execution of an instruction;
   wherein the I/O read information comprises eight bits of information, and wherein the I/O read information is conveyed to the emulator device over said two data lines carrying four serial bits each over a time period defined by four system clock cycles; and
   conveying interrupt vectors from the DUT to the emulator device during an interrupt service cycle, with the interrupt service cycle begins after assertion of an interrupt data line.

15. The method according to claim 14, wherein the DUT is selected from one of a microcontroller, a microprocessor, a microcomputer and an electronic circuit device incorporating an internal processor.

* * * * *